(12) United States Patent
Chen et al.

(10) Patent No.: US 11,329,072 B2
(45) Date of Patent: May 10, 2022

(54) ELECTRONIC DEVICE

(71) Applicant: Innolux Corporation, Miao-li County (TW)

(72) Inventors: Hung-Kun Chen, Miao-li County (TW); Li-Wei Sung, Miao-li County (TW); Shuo-Ting Hong, Miao-li County (TW); Chung-Le Chen, Miao-li County (TW)

(73) Assignee: Innolux Corporation, Miao-Li County (TW)

( * ) Notice: Subject to any disclaimer, the term of this patent is extended or adjusted under 35 U.S.C. 154(b) by 104 days.

(21) Appl. No.: 16/944,171

(22) Filed: Jul. 31, 2020

(65) Prior Publication Data

US 2021/0057451 A1    Feb. 25, 2021

(30) Foreign Application Priority Data

Aug. 21, 2019 (CN) .......................... 201910776051.6

(51) Int. Cl.
*H01L 21/00* (2006.01)
*H01L 27/12* (2006.01)
*H01L 29/786* (2006.01)

(52) U.S. Cl.
CPC ...... *H01L 27/124* (2013.01); *H01L 29/78633* (2013.01); *H01L 29/78645* (2013.01); *H01L 29/78696* (2013.01)

(58) Field of Classification Search
CPC ............ H01L 27/124; H01L 29/78633; H01L 29/78645
See application file for complete search history.

(56) References Cited

U.S. PATENT DOCUMENTS

| | | | | |
|---|---|---|---|---|
| 2009/0212290 A1* | 8/2009 | Youn | ...................... | H01L 27/124 257/59 |
| 2015/0301378 A1* | 10/2015 | Ishii | ................... | H01L 29/78675 349/110 |
| 2016/0155755 A1* | 6/2016 | Liu | ................... | H01L 29/78633 257/72 |

(Continued)

FOREIGN PATENT DOCUMENTS

| | | | | |
|---|---|---|---|---|
| CN | 104777690 | | 7/2015 | |
| CN | 105742294 | | 7/2016 | |
| CN | 107564938 | A * | 1/2018 | ........... G09G 3/3266 |

(Continued)

*Primary Examiner* — Laura M Menz
(74) *Attorney, Agent, or Firm* — JCIPRNET

(57) ABSTRACT

An electronic device of an embodiment of the disclosure includes a first substrate, a second substrate, and a driving layer. The first substrate and the second substrate are disposed opposite to each other, and the driving layer is disposed between the first substrate and the second substrate. The driving layer includes a scan line and a data line. The scan line is disposed on the first substrate and includes a first scan line segment. The first scan line segment has an opening and includes a first branch and a second branch. The first branch and the second branch are located on two opposite sides of the opening and are electrically connected in parallel with each other. The data line is disposed on the first substrate and intersects with the scan line. The electronic device of the embodiment of the disclosure may exhibit ideal display effect.

20 Claims, 8 Drawing Sheets

(56) References Cited

U.S. PATENT DOCUMENTS

2016/0254277 A1* 9/2016 Arao ................... G02F 1/13394
                                                            257/72
2021/0057451 A1* 2/2021 Chen ................. H01L 29/78645

FOREIGN PATENT DOCUMENTS

| CN | 111308809 A | * | 6/2020 | |
|----|-------------|---|--------|---|
| CN | 112419954 A | * | 2/2021 | ........... H01L 27/124 |
| CN | 111308809 B | * | 7/2021 | |

* cited by examiner

ELECTRONIC DEVICE

CROSS-REFERENCE TO RELATED APPLICATION

This application claims the priority benefit of China application serial no. 201910776051.6, filed on Aug. 21, 2019. The entirety of the above-mentioned patent application is hereby incorporated by reference herein and made a part of this specification.

BACKGROUND

Technical Field

The disclosure relates to an electronic device.

Description of Related Art

Electronic devices have been constantly developed towards higher resolution and higher quality. In an electronic device, the driving layer is mostly used to control electronic units (e.g., pixels). Therefore, the electrical properties and layout of the driving layer may be improved.

SUMMARY

The electronic device of an embodiment of the disclosure exhibits improved display effect.

According to an embodiment of the disclosure, an electronic device includes a first substrate, a second substrate, and a driving layer. The first substrate and the second substrate are disposed opposite to each other. The driving layer is disposed between the first substrate and the second substrate. The driving layer includes a scan line and a data line. The scan line is disposed on the first substrate and includes a first scan line segment. The first scan line segment has an opening and includes a first branch and a second branch. The first branch and the second branch are located on two opposite sides of the opening and are electrically connected in parallel with each other. The data line is disposed on the first substrate and intersects with the scan line.

In summary of the above, in the electronic device of the embodiments of the disclosure, a partial line segment of the scan line includes two branches electrically connected in parallel. The configuration of these two branches helps to reduce the overall impedance of the scan line. Accordingly, the driving layer can provide ideal driving performance, which helps to improve the display effect of the electronic device.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
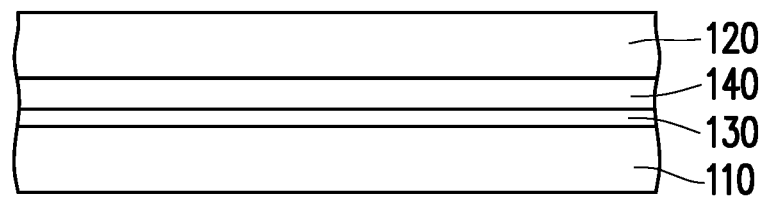
FIG. 1 is a schematic view of an electronic device of an embodiment of the disclosure.

"A structure (or layer, component, substrate, etc.) being located on/above another structure (or layer, component, substrate, etc.)" as described in the disclosure may mean that the two structures are adjacent and directly connected, or may mean that the two structures are adjacent but are not directly connected. "Not being directly connected" means that at least one intermediate structure (or intermediate layer, intermediate component, intermediate substrate, intermediate interval, etc.) is present between the two structures, where the lower surface of one structure is adjacent or directly connected to the upper surface of the intermediate structure, the upper surface of the other structure is adjacent or directly connected to the lower surface of the intermediate structure, and the intermediate structure may be composed of a single-layer or multi-layer physical structure or non-physical structure and is not specifically limited herein. In the disclosure, when one structure is disposed "on" another structure, it may mean that the one structure is "directly" on the another structure, or may mean that the one structure is "indirectly" on the another structure (i.e., at least one other structure is interposed between the one structure and the another structure).

Electrical connection or coupling as described in the disclosure may both refer to direct connection or indirect connection. In the case of direct connection, the terminal points of two components on the circuit are directly connected or are connected to each other via a conductor line segment. In the case of indirect connection, a switch, a diode, a capacitor, an inductor, a resistor, another suitable component, or a combination of the above components is present between the terminal points of two components on the circuit. However, the disclosure is not limited thereto.

In the disclosure, the length and width may be measured by an optical microscope, and the thickness may be measured according to a cross-sectional image in an electron microscope, but the disclosure is not limited thereto. In addition, there may be a certain error between any two values or directions used for comparison. If a first value is equal to a second value, it is implied that there may be an error of about 10% between the first value and the second value; if a first direction is perpendicular to a second direction, the angle between the first direction and the second direction may be 80 degrees to 100 degrees; and if the first direction is parallel to the second direction, the angle between the first direction and the second direction may be 0 degrees to 10 degrees.

In the disclosure, the embodiments to be described below may be used in combination as long as such combination does not depart from the spirit and scope of the disclosure. For example, part of the features of an embodiment may be combined with part of the features of another embodiment to form still another embodiment.

Reference will now be made in detail to the exemplary embodiments of the disclosure, examples of which are illustrated in the accompanying drawings. Whenever possible, the same reference numerals are used to represent the same or similar parts in the accompanying drawings and description.

Figure 2:
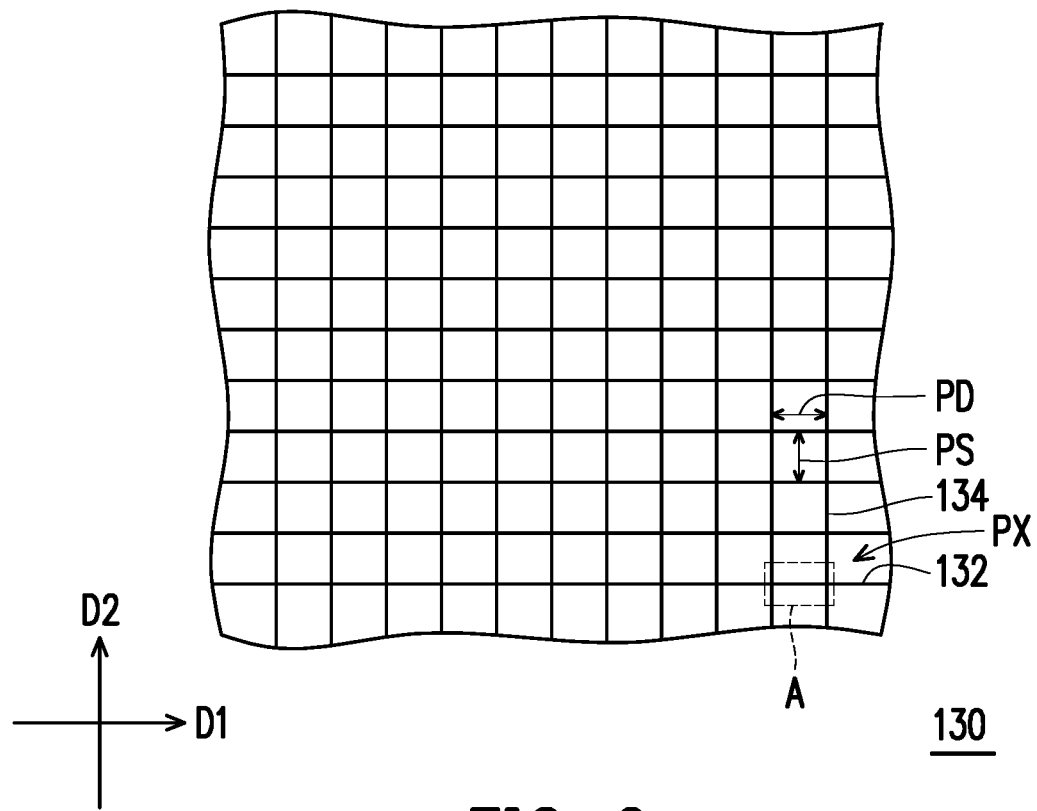
FIG. 2 is a schematic partial top view of a driving layer in the electronic device of FIG. 1.

FIG. 1 is a schematic view of an electronic device of an embodiment of the disclosure, and FIG. 2 is a schematic partial top view of a driving layer in the electronic device of FIG. 1. Referring to FIG. 1 and FIG. 2, an electronic device 100 includes a first substrate 110, a second substrate 120, a driving layer 130, and a medium layer 140. The first substrate 110 and the second substrate 120 are disposed opposite to each other, and are disposed opposite to each other in a face-to-face manner. In at least some embodiments, the first substrate 110 and the second substrate 120 may respectively be hard substrates or flexible substrates, such as transparent plastic substrates or glass substrates. For example, the materials of the first substrate 110 and the second substrate 120 may respectively include glass, quartz, sapphire, ceramic, polycarbonate (PC), polyimide (PI), polyethylene terephthalate (PET), liquid-crystal polymers (LCP), rubber, glass fiber, another suitable substrate material, or a combination of the above but are not limited thereto. The driving layer 130 and the medium layer 140 are both disposed between the first substrate 110 and the second substrate 120. The driving layer 130 is disposed, for example, on the first substrate 110 and is located between the first substrate 110 and the medium layer 140. The driving layer 130 may be configured to drive the medium layer 140. The material of the medium layer 140 may include a liquid crystal material, an electrowetting display material, an electrophoretic display material, an organic luminescent material, an inorganic luminescent material, a quantum dot (QD) material, a fluorescence material, a phosphor material, another suitable material, or a combination of the above materials but is not limited thereto. In some embodiments, the medium layer 140 may be a display medium layer but is not limited thereto. The electronic device 100 may be a display device, a sensing device, a lighting device, an antenna device, a splicing device, another suitable device, or a combination of the above devices but is not limited thereto.

As shown in FIG. 2, the driving layer 130 may include a plurality of scan lines 132 and a plurality of data lines 134, and the scan lines 132 intersect with the data lines 134 to define driving pixels PX. For example, two adjacent scan lines 132 and two adjacent data lines 134 may define one driving pixel PX. In some embodiments, the scan line 132 extends, for example, in a first direction D1, the data line 134 extends, for example, in a second direction D2, and the first direction D1 is different from the second direction D2. In some embodiments, the first direction D1 and the second direction D2 may be orthogonal to each other but are not limited thereto. In addition, in some embodiments, the scan line 132 and the data line 134 are respectively straight conductive lines, but the disclosure is not limited thereto. In other embodiments, at least one of the scan line 132 and the data line 134 is a non-straight conductive line. For example, when the scan line 132 is a non-straight conductive line, the conductive line may be formed by connecting a plurality of segments along the first direction D1, and the extending directions of part of the segments may intersect with the first direction D1. Accordingly, although it is likely that part of the segments of the scan line 132 do not extend in the first direction D1, the overall extending direction of the scan line 132 (e.g., the connecting line of the two opposite ends) is still the first direction D1. When the data line 134 is a non-straight conductive line, it may also be understood to have a similar layout.

Figure 3:
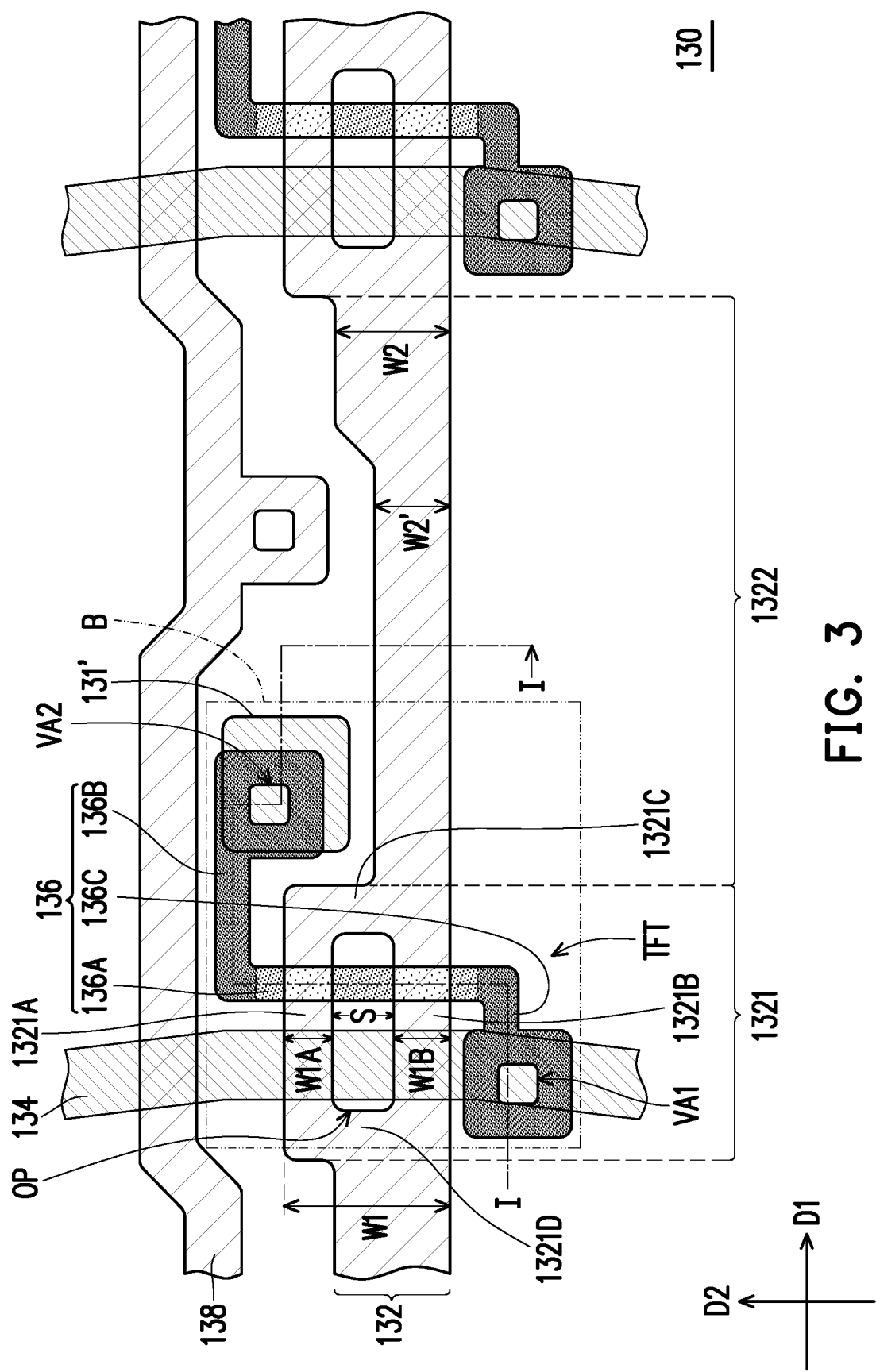
FIG. 3 is a schematic partial view of a region A of the driving layer in FIG. 2.
Figure 4:
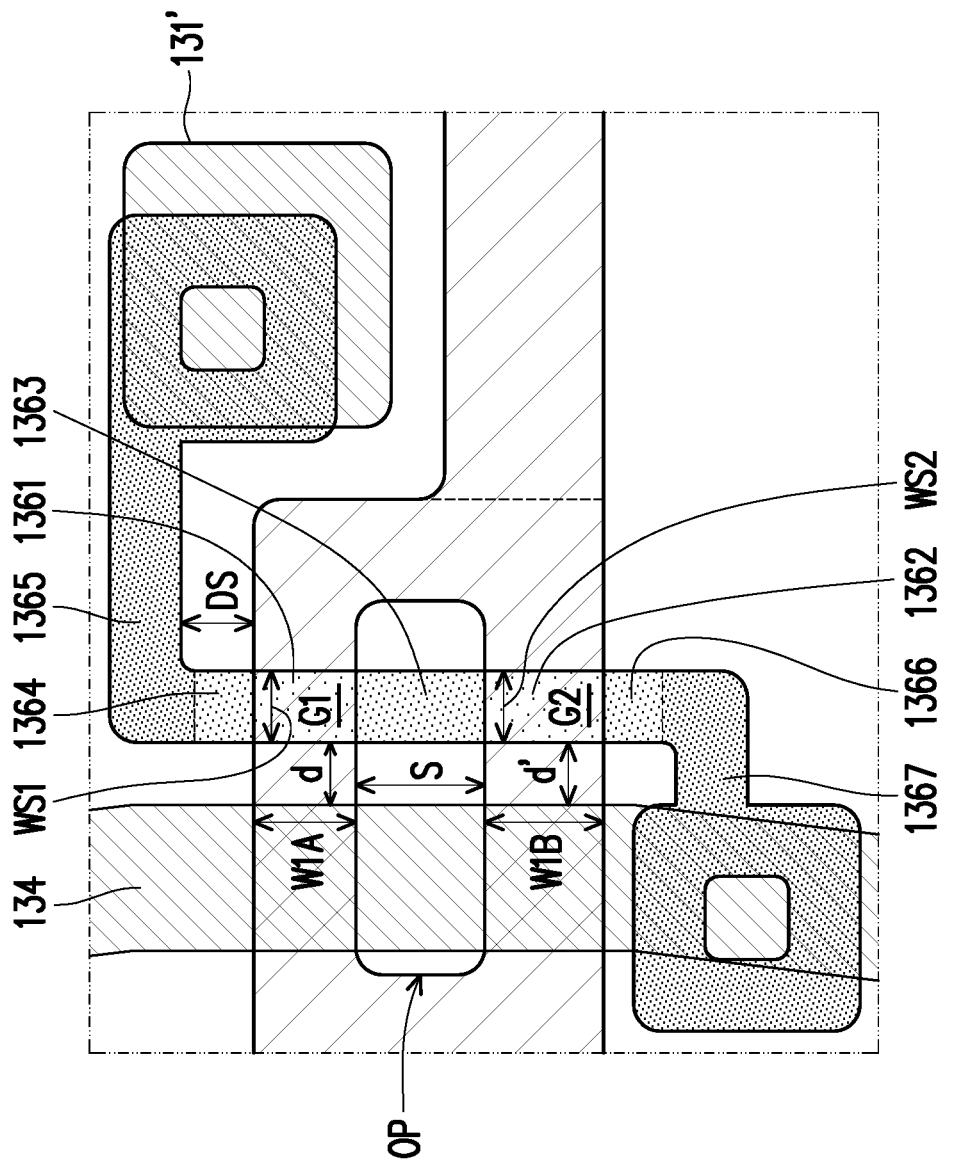
FIG. 4 is a schematic enlarged view of a region B of the driving layer of FIG. 3.

FIG. 3 is a schematic partially enlarged view of a region A of the driving layer in FIG. 2, and FIG. 4 is a schematic enlarged view of a region B of the driving layer of FIG. 3. Referring to FIG. 2 and FIG. 3, the scan line 132 of the driving layer 130 may include a first scan line segment 1321 and a second scan line segment 1322. The first scan line segment 1321 is connected to the second scan line segment 1322, and, for example, one single scan line 132 of FIG. 2 may be formed by alternately connecting a plurality of first scan line segments 1321 and a plurality of second scan line segments 1322 in the first direction D1. In the present embodiment, the first scan line segment 1321 and the second scan line segment 1322 may have different pattern designs. For example, the first scan line segment 1321 may have an opening OP and include a first branch 1321A and a second branch 1321B. The first branch 1321A and the second branch 1321B are located on two opposite sides of the opening OP and are electrically connected in parallel with each other. The second scan line segment 1322 may be a single-line line segment and does not have a plurality of branches.

In the present embodiment, the opening OP is, for example, an enclosed opening. Moreover, the first branch 1321A and the second branch 1321B are located on two opposite sides of the opening OP, so that a spacing S is present between the first branch 1321A and the second branch 1321B. Although the first branch 1321A and the second branch 1321B are spaced apart from each other, the first scan line segment 1321 further includes a connection portion 1321C connected between the first branch 1321A and the second branch 1321B at one end and a connection portion 1321D connected between the first branch 1321A and the second branch 1321B at the other end. Namely, the connection portion 1321C and the connection portion 1321D are opposite to each other. Accordingly, two connection portions 1321C and 1321D, the first branch 1321A, and the second branch 1321B collectively enclose the opening OP. In some embodiments, the first branch 1321A may have a first branch line width W1A, the second branch 1321B may have a second branch line width W1B, and the sum of the first branch line width W1A, the second branch line width W1B, and the spacing S may be regarded as a first scan line width W1 of the first scan line segment 1321. The second scan line segment 1322 may have a second scan line width W2, and the first scan line width W1 may be greater than the second scan line width W2. In other words, the first scan line segment 1321 is the segment having the greatest line width in the entire scan line 132. In some embodiments, the second scan line segment 1322 may have different segments having different line widths, and some of the segments may have a second scan line width W2'. In some possible embodiments, the second scan line width W2' may be less than or equal to the sum of the first branch line width W1A and the second branch line width W1B.

In some embodiments, the first branch line width W1A may be the maximum width of the first branch 1321A measured in a direction perpendicular to the first direction D1, the second branch line width W1B may be the maximum width of the second branch 1321B measured in the direction perpendicular to the first direction D1, and the second scan line widths W2 or W2' may be the maximum width of the second scan line segment 1322 measured in the direction perpendicular to the first direction D1. In some embodiments, the spacing S may be the maximum distance between the first branch 1321A and the second branch 1321B measured in the direction perpendicular to the first direction D1.

In the present embodiment, the first branch line width W1A and the second branch line width W1B may be the same but are not limited thereto. In addition, the first scan line width W1 may be, for example, less than or equal to a quarter of a pitch PS (labeled in FIG. 2) between two adjacent scan lines 132, and the spacing S between the first branch 1321A and the second branch 1321B may be, for example, less than or equal to one fifth of the pitch PS between two adjacent scan lines 132. The so-called pitch PS of the two adjacent scan lines 132 may be regarded as the distance between the middle lines of two adjacent scan lines 132 in the direction perpendicular to the first direction D1, the minimum distance between the upper boundary lines of two adjacent scan lines 132 in the direction perpendicular to the first direction D1, or the minimum distance between the lower boundary lines of two adjacent scan lines 132 in the direction perpendicular to the first direction D1. The spacing S between the first branch 1321A and the second branch 1321B may be configured to separate the first branch 1321A and the second branch 1321B. Therefore, the minimum value of the spacing S may be determined, for example, according to the capability of the manufacturing technique.

In the present embodiment, the data line 134 may intersect with the first branch 1321A and/or the second branch 1321B. In other words, the data line 134 may overlap with the first branch 1321A and/or overlap with the second branch 1321B as viewed from the top view. Since the first branch 1321A and the second branch 1321B are electrically connected in parallel with each other, the impedance caused by the data line 134 to the first branch 1321A and the impedance caused by the data line 134 to the second branch 1321B are also connected in parallel with each other. Such parallel connection of impedances will cause the equivalent impedance caused by the data line 134 to the scan line 132 to decrease, which helps to reduce the load on the scan line 132 and can thus alleviate the resistance-capacitance delay effect of the scan line 132. Accordingly, the signal transmission performance and quality of the scan line 132 can be improved. However, the disclosure is not limited thereto, and in other embodiments, the data line 134 may overlap with other portions of the scan line 132 as viewed from the top view but is not limited thereto.

In FIG. 3, the driving layer 130 may further include a semiconductor layer 136. The semiconductor layer 136 may include at least a first segment 136A, a second segment 136B, and a third segment 136C. The extending direction of the first segment 136A is different from the extending direction of the second segment 136B, and the extending direction of the first segment 136A is different from the extending direction of the third segment 136C. Herein, the transition between the first segment 136A and the second segment 136B and the transition between the first segment 136A and the third segment 136C may both be non-right-angle (i.e., curved) transitions. The first segment 136A may intersect with the scan line 132, and the extending direction of the first segment 136A may substantially be the second direction D2. In other words, the first segment 136A may be substantially parallel to the extending direction of the data line 134 (i.e., the second direction D2) or may be substantially parallel to part of the segments of the data line 134.

The second segment 136B is a segment extending from one end of the first segment 136A away from the data line 134, and the third segment 136C is a segment extending from the other end of the first segment 136A toward the data line 134. The end of the third segment 136C may be electrically connected to the data line 134, and the end of the second segment 136B may be configured to electrically connect a pixel electrode (not shown). In other alternative embodiments, the extending direction of the first segment 136A may be different from the second direction D2.

In addition, as shown in FIG. 3, the driving layer 130 may further include a common line 138, and the common line 138 extends substantially in the first direction D1 but is not limited thereto. The common line 138 may be formed in the same layer or by the same manufacturing process as the scan line 132, and the common line 138 may intersect with the data line 134. The common line 138 may be electrically independent of the scan line 132.

In FIG. 3 and FIG. 4, the first segment 136A may intersect with the first branch 1321A, the opening OP, and the second branch 1321B. Accordingly, the semiconductor layer 136 may include a first channel region 1361, a second channel region 1362, and an intermediate region 1363 located between the first channel region 1361 and the second channel region 1362. The first channel region 1361 overlaps with the first branch 1321A (not labeled in FIG. 4 for clarity of the figure, but reference may be made to FIG. 3), and the second channel region 1362 overlaps with the second branch 1321B (not labeled in FIG. 4 for clarity of the figure, but reference may be made to FIG. 3). The intermediate region 1363 is, for example, located in the opening OP, and does not overlap with the first branch 1321A and does not overlap with the second branch 1321B. In other words, the intermediate region 1363 is located between the first branch 1321A and the second branch 1321B as viewed from the top view.

In the present embodiment, the portion of the first branch 1321A overlapping with the first channel region 1361 may be regarded as a first gate G1, the portion of the second branch 1321B overlapping with the second channel region 1362 may be regarded as a second gate G2, the second segment 136B of the semiconductor layer 136 may be regarded as a drain, and the third segment 136C of the semiconductor layer 136 may be regarded as a source. Accordingly, the semiconductor layer 136 may define an active component (e.g., a thin film transistor) having dual gates (i.e., the first gate G1 and the second gate G2). Specifically, the second segment 136B of the semiconductor layer 136 may be a drain region 1365, the third segment 136C of the semiconductor layer 136 may be a source region 1367, and the first segment 136A of the semiconductor layer 136 may include a low doping region 1364, the first channel region 1361, the intermediate region 1363, the second channel region 1362, and a low doping region 1366. The low doping region 1364, the low doping region 1366, and the intermediate region 1363 have doping concentrations lower than those of the drain region 1365 (i.e. the second segment 136B) and the source region 1367 (i.e. the third segment 136C), and the first channel region 1361 and the second channel region 1362 have doping concentrations lower than those of the low doping region 1364, the low doping region 1366, and the intermediate region 1363. The first channel region 1361 and the second channel region 1362 may also be substantially formed of an intrinsic semiconductor without being doped.

In some embodiments, the maximum length of the low doping region 1364 in the second direction D2 is about half of the maximum length of the intermediate region 1363 in the second direction D2. Similarly, the maximum length of the low doping region 1366 in the second direction D2 is about half of the maximum length of the intermediate region 1363 in the second direction D2. In other words, the maximum length of the intermediate region 1363 is about twice to three times the maximum length of the low doping region 1364 or the low doping region 1366, and the maximum length of the intermediate region 1363 may be substantially equal to the spacing S between the first branch 1321A and the second branch 1321B. In some embodiments, the maximum length of the low doping region 1364 or the low doping region 1366 in the second direction D2 may be in the range of 0.5 μm to 3.0 μm (0.5 μm≤maximum length≤3.0 μm) or in the range of 1 μm to 2.5 μm (1 μm≤maximum length≤2.5 μm) and may be, for example, 1.9 μm, 2 μm, 1.5 μm, or another value in the range. In addition, the second segment 136B of the semiconductor layer 136 may be spaced apart from the scan line 132. In some embodiments, a distance DS between the second segment 136B and the scan line 132 may be at least half of the spacing S to ensure that the second segment 136B does not overlap with the scan line 132 as viewed from the top view. In some embodiments, the distance DS may be the maximum distance between the second segment 136B and the scan line 132 in the second direction D2.

In the present embodiment, the first channel region 1361, the intermediate region 1363, and the second channel region 1362 in the first segment 136A are arranged along an arrangement direction. The arrangement direction may be regarded as the extending direction of the first segment 136A.

The first channel region 1361 and the second channel region 1362 respectively have a width WS1 and a width WS2. The width WS1 is the maximum width of the first channel region 1361 in a direction perpendicular to the second direction D2, and the width WS2 is the maximum width of the second channel region 1362 in the direction perpendicular to the second direction D2. In some embodiments, the width WS1 and the width WS2 may be identical to each other. Accordingly, the component channel length and the component channel width defined by the first channel region 1361 may be equal to the component channel length and the component channel width defined by the second channel region 1362. In other words, the first channel region 1361 and the second channel region 1362 may define channels of the same aspect ratio.

In the present embodiment, the first channel region 1361 is spaced apart from the data line 134 by a distance d. The distance d may be the maximum distance of the first channel region 1361 from the data line 134 in the direction perpendicular to the second direction D2. In some embodiments, the second channel region 1362 is spaced apart from the data line 134 by a distance d' in the direction perpendicular to the second direction D2. In some embodiments, the distance d and the distance d' may be the same or different, and one of the distance d and the distance d' may be zero. For example, the semiconductor layer 136 may be configured such that at least one of the first channel region 1361 and the second channel region 1362 does not overlap with the data line 134. In some embodiments, when neither of the first channel region 1361 and the second channel region 1362 overlaps with the data line 134, the electrical signals or voltage states of the first channel region 1361 and the second channel region 1362 are less likely to be affected by the electrical signal or voltage on the data line 134, and namely, the coupling effect of the data line 134 on the first channel region 1361 and the second channel region 1362 is less obvious, which helps to stabilize the performance of the first channel region 1361 and the second channel region 1362, so that the driving layer 130 provides improved driving effect. In some embodiments, the distance d may be greater than or equal to 1 μm and may be less than or equal to half of a pitch PD (labeled in FIG. 2) between two data lines 134. The so-called pitch PD of two data lines 134 may be regarded as the distance between the middle lines of two adjacent data lines 134 in the first direction D1, the maximum distance between the left boundary lines of two adjacent data lines 134 in the first direction D1, or the maximum distance between the right boundary lines of two adjacent data lines 134 in the first direction D1.

In addition, due to the pattern design of the first branch 1321A and the second branch 1321B, the first gate G1 and the second gate G2 can be electrically connected in parallel with each other. The impedance caused to the scan line 132 by the first channel region 1361 of the semiconductor layer 136 overlapping with the first gate G1 and the impedance caused to the scan line 132 by the second channel region 1362 of the semiconductor layer 136 overlapping with the second gate G2 are also connected in parallel with each other. Such parallel connection of impedances will cause the equivalent impedance caused by the semiconductor layer 136 to the scan line 132 to decrease, which helps to reduce the load on the scan line 132 and can thus alleviate the resistance-capacitance delay effect of the scan line 132. Accordingly, the signal transmission performance and quality of the scan line 132 can be improved.

Figure 5:
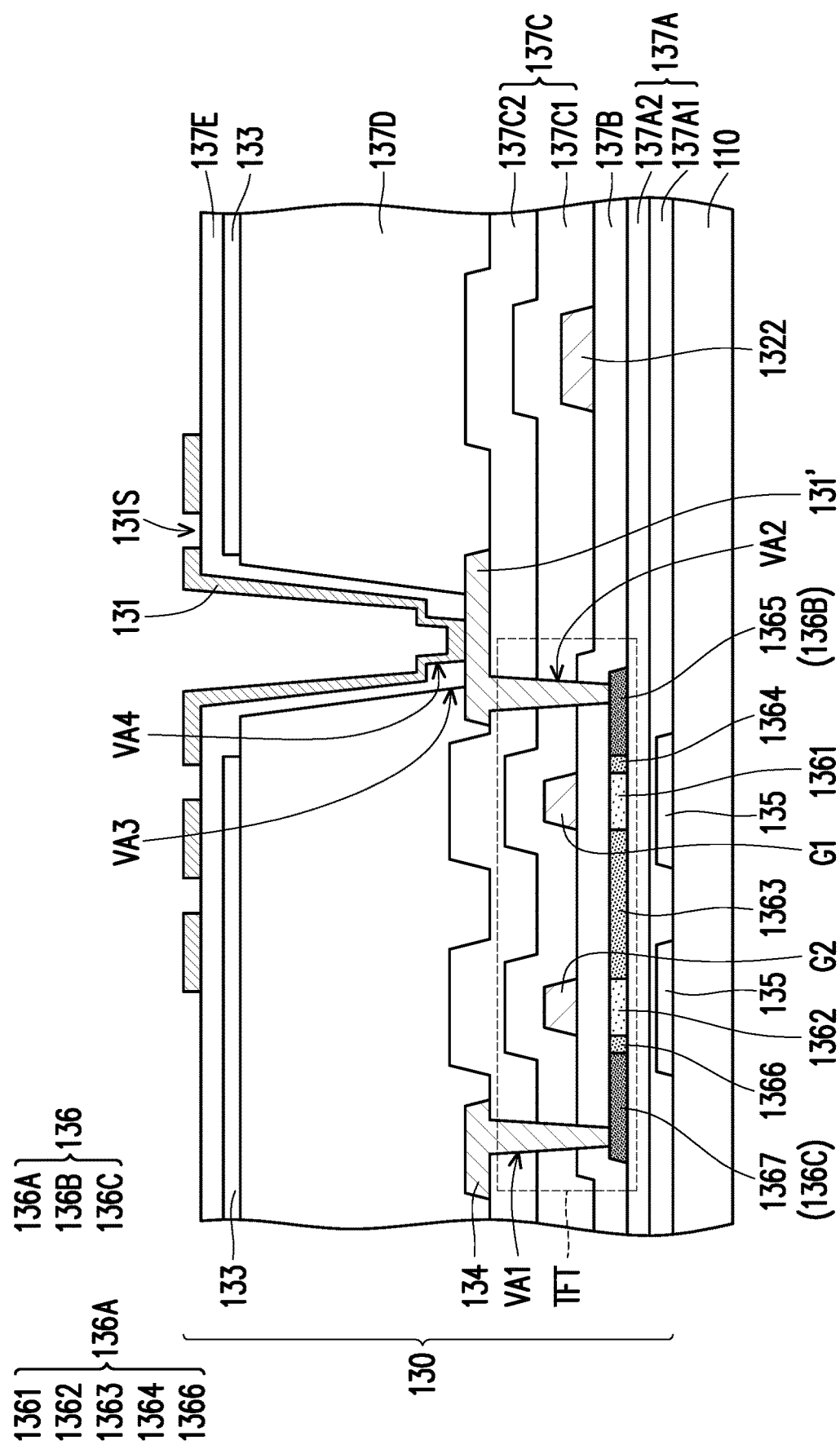
FIG. 5 is a schematic view of a cross-sectional structure of the driving layer of FIG. 3 taken along sectional line I-I according to an embodiment.

FIG. 5 is a schematic view of a cross-sectional structure of the driving layer of FIG. 3 taken along sectional line I-I according to an embodiment. Referring to FIG. 3, FIG. 4, and FIG. 5, the driving layer 130 is disposed, for example, on the first substrate 110, and in addition to the scan line 132, the data line 134, the semiconductor layer 136, and the common line 138, the driving layer 130 further includes a pixel electrode 131, a common electrode 133, a light shielding layer 135, and a plurality of insulating layers 137A to 137E. FIG. 4 only shows the first gate G1, the second gate G2, and the second scan line segment 1322 of the scan line 132, but reference may be made to FIG. 3 and the relevant descriptions for the specific layout of the scan line.

As shown in FIG. 5, in the present embodiment, the light shielding layer 135 is disposed on the first substrate 110, and the first channel region 1361 and the second channel region 1362 of the semiconductor layer 136 overlap with the light shielding layer 135. Accordingly, the light shielding layer 135 can reduce the external light irradiated to the first channel region 1361 and the second channel region 1362 to ensure the electrical properties of the first channel region 1361 and the second channel region 1362. For example, leakage caused by irradiation of light to the first channel region 1361 and the second channel region 1362 can be reduced. In some embodiments, the light shielding layer 135 may be manufacturing by adopting a non-light-transmitting metal material or other materials. The insulating layer 137A is disposed on the first substrate 110 and covers the light shielding layer 135. Herein, the insulating layer 137A may include a first sub-layer 137A1 and a second sub-layer 137A2 but is not limited thereto. The material of the first sub-layer 137A1 may include silicon nitride, and the material of the second sub-layer 137A2 may include silicon oxide. In other embodiments, the material of the insulating layer 137A may include another insulating material, and the insulating layer 137A may be composed of only one single layer or may be selectively composed of three or more layers.

The semiconductor layer 136 is disposed on the first substrate 110 and is formed on the insulating layer 137A. In other embodiments, the light shielding layer 135 and the insulating layer 137A may be omitted, and the semiconductor layer 136 may be directly disposed on the first substrate 110. The material of the semiconductor layer 136 may include low-temperature polycrystalline silicon, amorphous silicon, crystalline silicon, metal oxide semiconductor, organic semiconductor, other materials having semiconductor properties, or a combination of the above but is not limited thereto. Furthermore, the insulating layer 137B is disposed on the first substrate 110 and covers the semiconductor layer 136. The scan line 132 including the first gate G1, the second gate G2, and the second scan line segment 1322 is disposed on the insulating layer 137B. In addition, the common line 138 in FIG. 3 may also be disposed on the insulating layer 137B and may be in the same film layer as the scan line 132 but is not limited thereto. Herein, the insulating layer 137B is located between the semiconductor layer 136 and the scan line 132 to serve as a gate insulating layer. In some embodiments, the material of the insulating layer 137B may include silicon oxide but is not limited thereto. In other embodiments, the material of the insulating layer 137B may include silicon oxide, silicon nitride, silicon oxynitride, hafnium oxynitride, or a combination of the above but is not limited thereto. In the present embodiment, the scan line 132 and the semiconductor layer 136 may define an active component TFT. The semiconductor layer 136 may be divided into the first segment 136A, the second segment 136B, and the third segment 136C according to the patterns (or the extending directions of different segments) in the top view, and may also be divided into the first channel region 1361, the second channel region 1362, the intermediate region 1363, the low doping region 1364, the drain region 1365, the low doping region 1366, and the source region 1367 according to the different degrees of doping.

The insulating layer 137C covers the scan line 132, and the data line 134 is disposed on the insulating layer 137C. In the present embodiment, the insulating layer 137C covering the scan line 132 includes a third sub-layer 137C1 and a fourth sub-layer 137C2 but is not limited thereto. In other embodiments, the insulating layer 137C may be one single film layer. The third sub-layer 137C1 and the fourth sub-layer 137C2 may be manufactured by using the same material or different materials. The materials of the third sub-layer 137C1 and the fourth sub-layer 137C2 may respectively include silicon oxide, silicon nitride, silicon oxynitride, hafnium oxynitride, or a combination of the above but are not limited thereto. In some embodiments, the third sub-layer 137C1 and the fourth sub-layer 137C2 may be manufactured by using different materials. For example, the material of the third sub-layer 137C1 may include silicon nitride, and the material of the fourth sub-layer 137C2 may include silicon oxide.

The data line 134 is formed on the insulating layer 137C, and is in contact with and electrically connected to the source region 1367 of the semiconductor layer 136 via a via VA1. The materials of the scan line 132 and the data line 134 may respectively include conductive materials composed of molybdenum, aluminum, copper, titanium, or a combination of the above but are not limited thereto. The via VA1 penetrates through the insulating layer 137C and the insulating layer 137B, and the data line 134 extends into the via VA1 to be physically and electrically connected to the source region 1367. Furthermore, while the data line 134 is manufactured, a pixel connection electrode 131' may also be manufactured at the same time. The pixel connection electrode 131' is disposed on the insulating layer 137C and is electrically connected to the drain region 1365 of the semiconductor layer 136 via a via VA2. The via VA2 penetrates through the insulating layer 137C and the insulating layer 137B, and the pixel connection electrode 131' extends into the via VA2 to be physically and electrically connected to the drain region 1365.

The insulating layer 137D is disposed on the insulating layer 137C and covers at least a portion of the data line 134. The insulating layer 137D may be an insulating layer of an organic material and may be thicker than other insulating layers to provide planarization effect. The insulating layer 137D may be composed of materials such as perfluoro-alkoxy polymer resin (PFA), polymer film on array (PFA), fluoroelastomers, etc. but is not limited thereto. The common electrode 133 is disposed on the insulating layer 137D, and the common electrode 133 may be connected to the common line 138 shown in FIG. 3. The material of the common electrode 133 includes indium tin oxide, indium zinc oxide, aluminum zinc oxide, etc. The insulating layer 137E is disposed on the first substrate 110 and covers the common electrode 133. The material of the insulating layer 137E includes silicon oxide, silicon nitride, silicon oxynitride, hafnium oxynitride, or a combination of the above.

The pixel electrode 131 is disposed on the insulating layer 137E, and the pixel electrode 131 is, for example, physically connected (or electrically connected) to the pixel connection electrode 131' via a via VA3 and a via VA4. Herein, the via VA3 penetrates through the insulating layer 137D and exposes the pixel connection electrode 131', and the insulating layer 137E may extend into the via VA3. The via VA4 penetrates through the insulating layer 137E and exposes the pixel connection electrode 131', and the pixel electrode 131 may extend into the via VA4 to be physically connected (or electrically connected) to the pixel connection electrode 131'. In other embodiments, while the via VA3 is manufactured, a via (not shown) between the common electrode 133 and the common line 138 shown in FIG. 3 may be formed at the same time. In the present embodiment, the pixel electrode 131 and the common electrode 133 may partially overlap, and the pixel electrode 131 may have a plurality of slits 131S. The slit 131S may overlap with the common electrode 133 in the normal direction of the first substrate 110. Accordingly, when the pixel electrode 131 and the common electrode 133 are respectively written with corresponding voltages, a driving electric field may be formed to drive the medium layer (e.g., the medium layer 140 shown in FIG. 1). In other embodiments, the stacking order of the pixel electrode 131 and the common electrode 133 may be reversed. In other words, the pixel electrode 131 may be disposed between the insulating layer 137D and the insulating layer 137E, and the common electrode 133 may be disposed on the surface of the insulating layer 137E away from the first substrate 110. The pixel electrode 131 and the common electrode 133 shown in FIG. 5 are only illustrative, and in other embodiments, the pixel electrode 131 and the common electrode 133 may have other suitable patterns or configurations but are not limited thereto.

Figure 6:
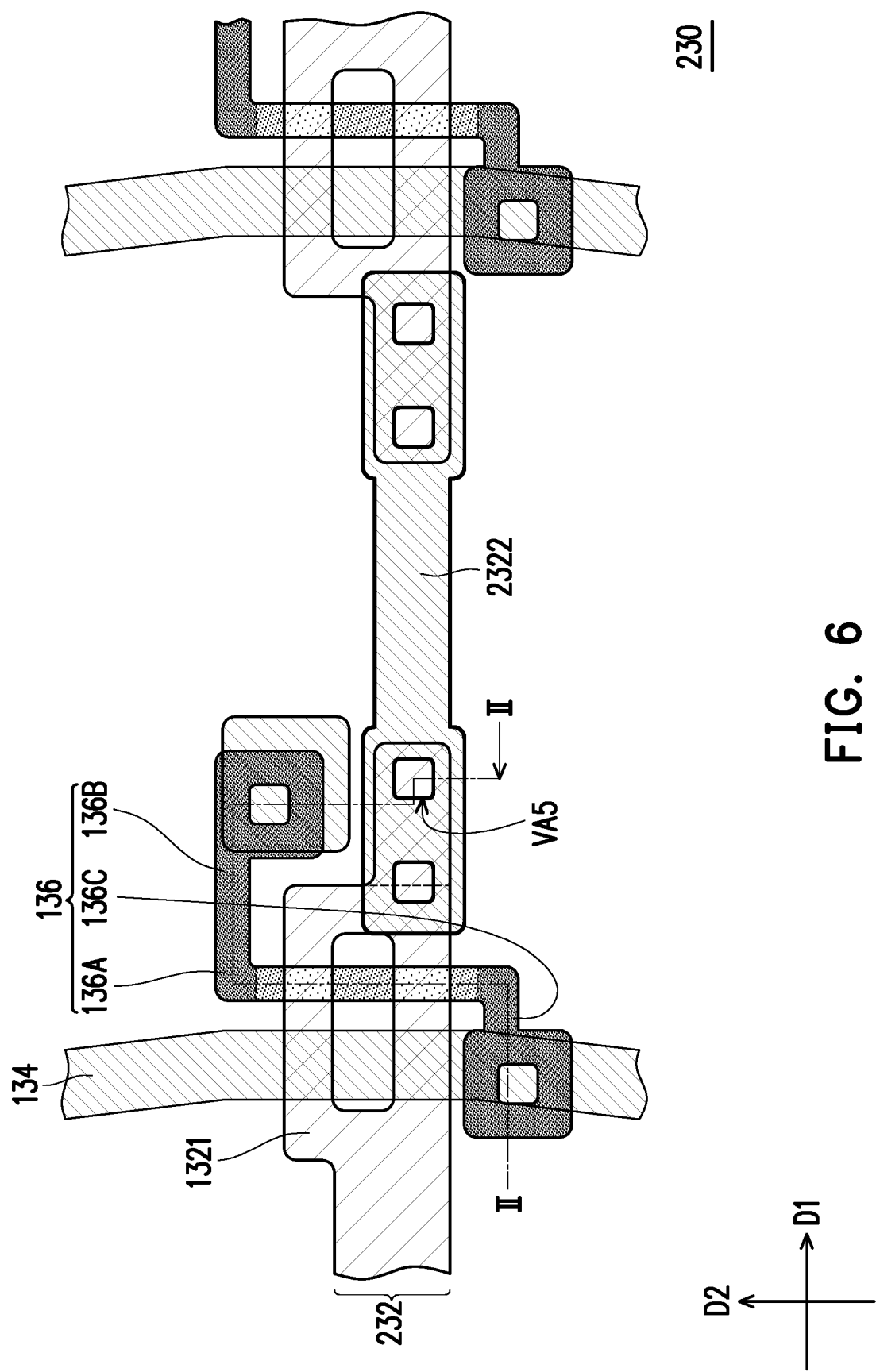
FIG. 6 is a schematic partial top view of a driving layer of another embodiment of the disclosure.
Figure 7:
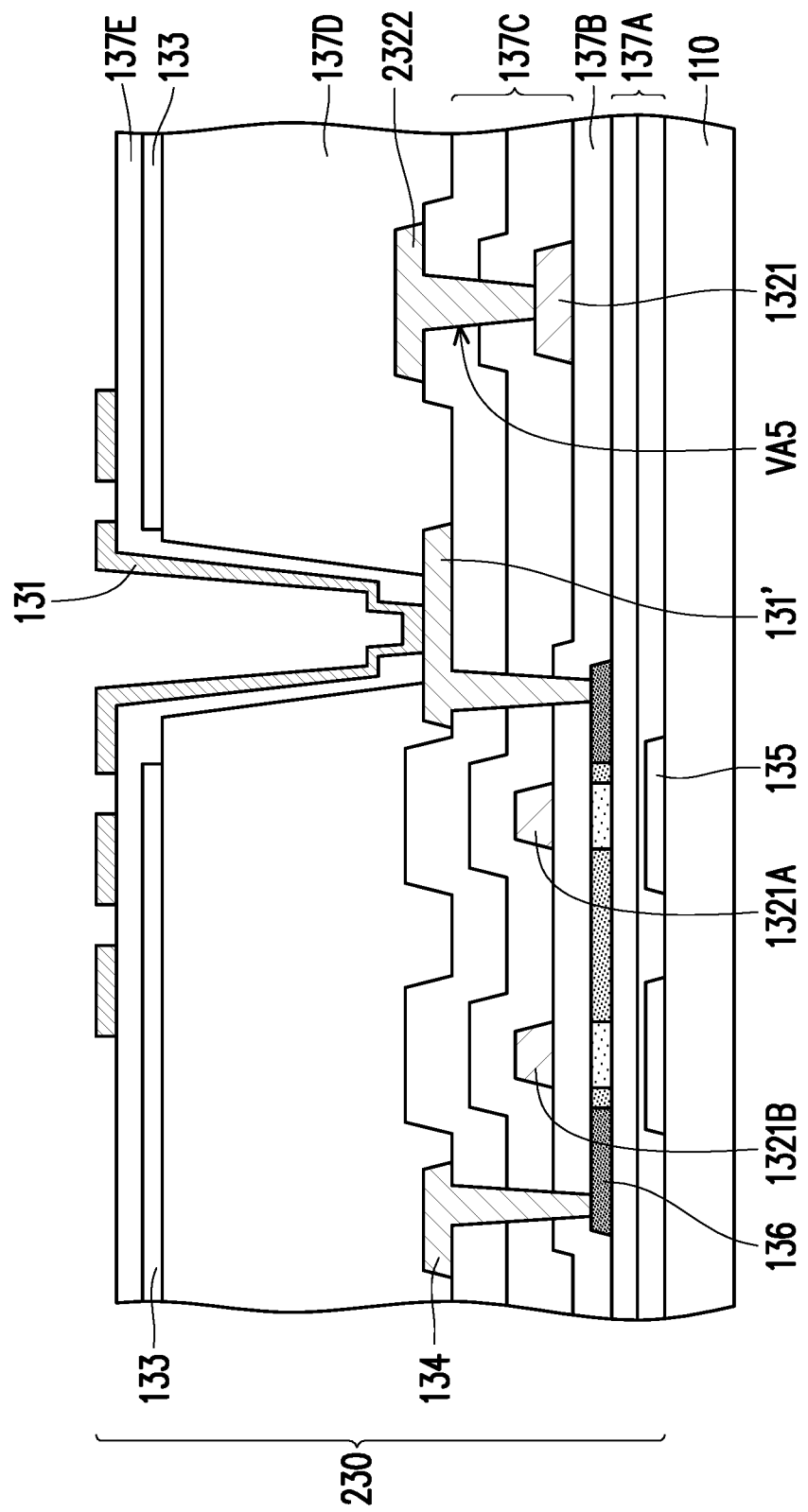
FIG. 7 is a schematic view of a cross-sectional structure of the driving layer of FIG. 6 taken along sectional line II-II according to an embodiment.

FIG. 6 is a schematic partial top view of a driving layer of another embodiment of the disclosure, and FIG. 6 shows a part of the driving layer of the region A in FIG. 2 according to another embodiment. FIG. 7 is a schematic view of a cross-sectional structure of the driving layer of FIG. 6 taken along sectional line II-II according to an embodiment. In FIG. 6 and FIG. 7, a driving layer 230 is substantially similar to the driving layer 130 of FIG. 3 to FIG. 5. Therefore, the same and similar components are denoted by the same and similar reference numerals in the two embodiments. Specifically, the driving layer 230 disposed on the first substrate 110 includes at least a scan line 232, a data line 134, and a semiconductor layer 136, and the scan line 232 includes a first scan line segment 1321 and a second scan line segment 2322 connected to the first scan line segment 1321. Herein, reference may be made to the descriptions in the foregoing embodiments for the specific structures, materials, functions, etc. of the first scan line segment 1321 of the scan line 232, the data line 134, and the semiconductor layer 136, which shall not be repeatedly described. In addition, in FIG. 6, reference may also be made to the descriptions in the foregoing embodiments for descriptions of the pixel electrode 131, the pixel connection electrode 131', the common electrode 133, the light shielding layer 135, and the insulating layers 137A to 137E of the driving layer 230, which shall not be repeatedly described herein.

Specifically, in the present embodiment, the scan line 232 includes the first scan line segment 1321 and the second scan line segment 2322. The second scan line segment 2322 and the first scan line segment 1321 are in different film layers and are electrically connected to each other via a via VA5. Specifically, the second scan line segment 2322 may be in the same film layer as the data line 134. In other words, the second scan line segment 2322 is manufactured from a film layer located between the insulating layer 137C and the insulating layer 137D. On the other hand, the first scan line segment 1321 is manufactured from a film layer located between the insulating layer 137B and the insulating layer 137C. The via VA5 may penetrate through the insulating layer 137C and expose a portion of the first scan line segment 1321, and the second scan line segment 2322 extends into the via VA5 to be physically connected (or electrically connected) to the first scan line segment 1321.

In some embodiments, the materials of the first scan line segment 1321 and the second scan line segment 2322 may respectively include conductive materials composed of molybdenum, aluminum, copper, titanium, or a combination of the above but are not limited thereto. In some embodiments, at least one of the first scan line segment 1321 and the second scan line segment 2322 has a multi-layer structure formed by stacking a plurality of conductive material layers. In some embodiments, the first scan line segment 1321 and the second scan line segment 2322 may include different materials. For example, the material of the second scan line segment 2322 may have better electrical conductivity than that of the first scan line segment 1321. Accordingly, not only can the parallel connection of the first branch 1321A and the second branch 1321B in the first scan line segment 1321 reduce the impedance of the scan line 232, but the better electrical conductivity of the second scan line segment 2322 can also help to reduce the impedance of the scan line 232, which helps to alleviate the resistance-capacitance delay effect of the scan line 232.

Figure 8:
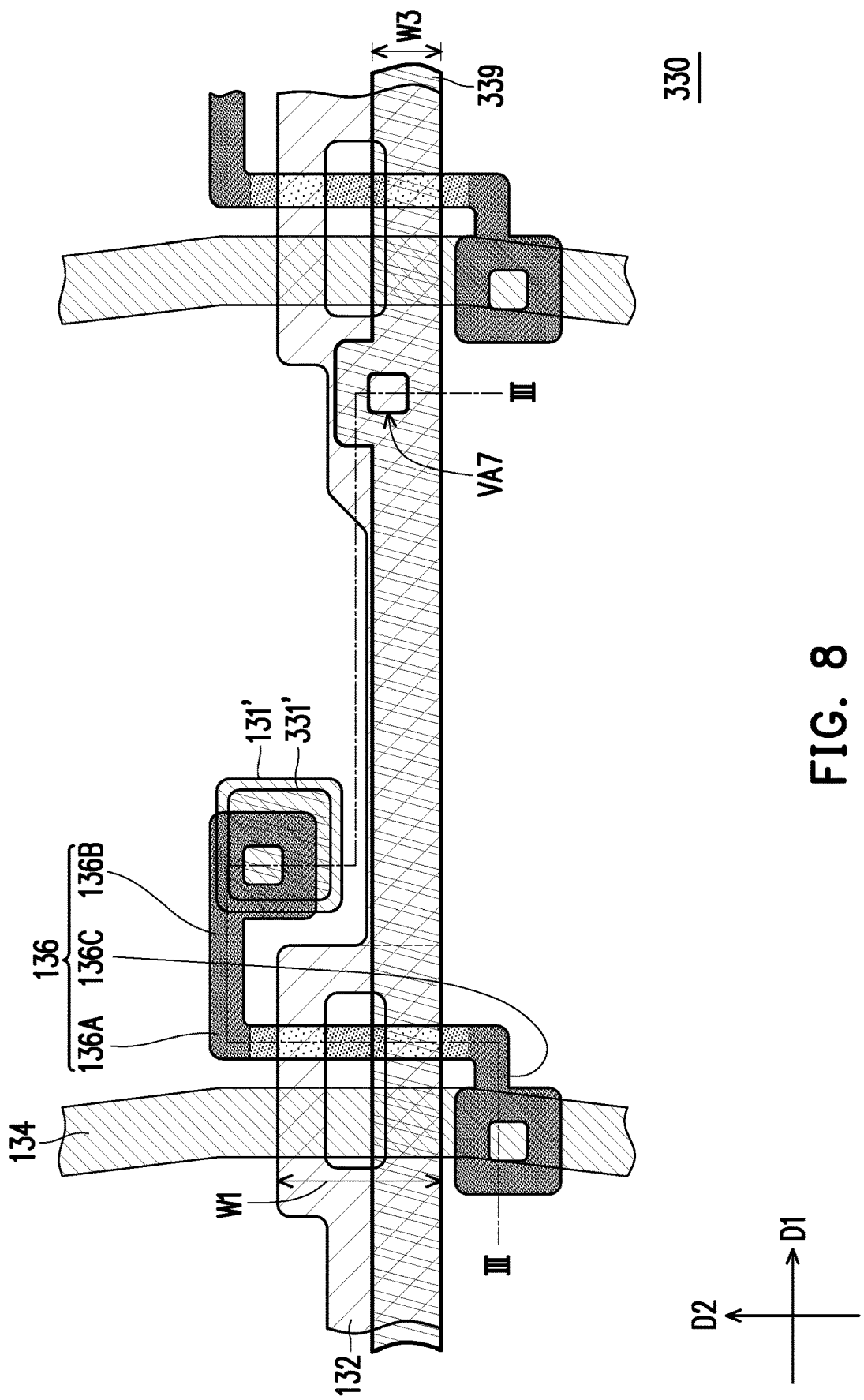
FIG. 8 is a schematic partial top view of a driving layer of still another embodiment of the disclosure.
Figure 9:
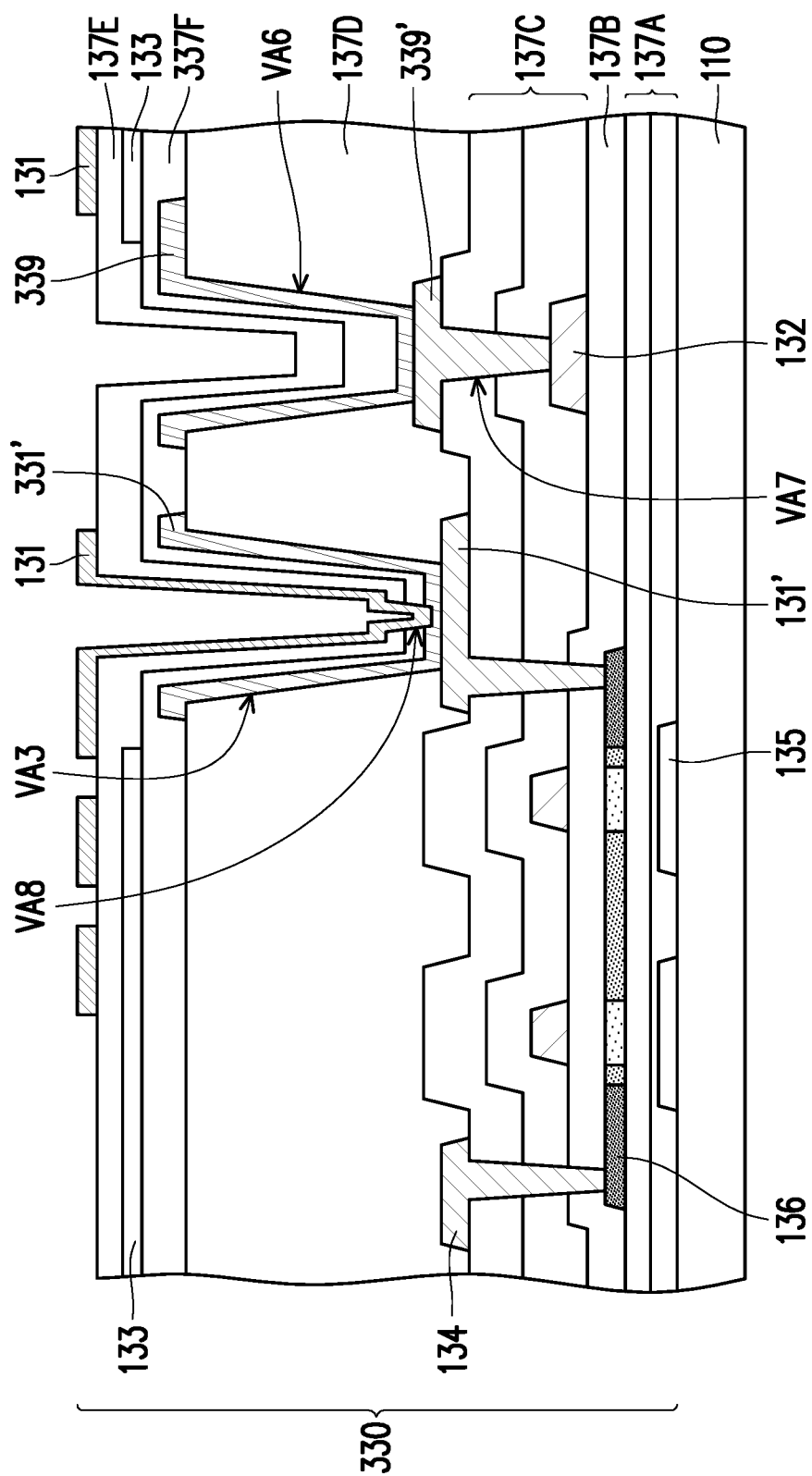
FIG. 9 is a schematic view of a cross-sectional structure of the driving layer of FIG. 8 taken along sectional line III-III according to an embodiment.

FIG. 8 is a schematic partial top view of a driving layer of still another embodiment of the disclosure, and FIG. 8 shows a part of the driving layer of the region A in FIG. 2 according to still another embodiment. FIG. 9 is a schematic view of a cross-sectional structure of the driving layer of FIG. 8 taken along sectional line III-III according to an embodiment. In FIG. 8 and FIG. 9, a driving layer 330 is substantially similar to the driving layer 130 of FIG. 3 to FIG. 5. Therefore, the same and similar components are denoted by the same and similar reference numerals in the two embodiments. Specifically, the driving layer 330 includes at least a scan line 132, a data line 134, and a semiconductor layer 136. Herein, reference may be made to the descriptions in the foregoing embodiments for the specific structures, materials, functions, etc. of the scan line 132, the data line 134, and the semiconductor layer 136, which shall not be repeatedly described. In addition, in FIG. 9, reference may also be made to the descriptions in the foregoing embodiments for descriptions of the pixel electrode 131, the pixel connection electrode 131', the common electrode 133, the light shielding layer 135, and the insulating layers 137A to 137E of the driving layer 330, which shall not be repeatedly described herein. Specifically, the difference from the embodiment of FIG. 3 to FIG. 5 lies in that the driving layer 330 of the present embodiment further includes an auxiliary scan line 339, a scan connection electrode 339', an insulating layer 337F, and an auxiliary pixel connection electrode 331'. The insulating layer 337F is disposed between the insulating layer 137D and the insulating layer 137E, such that the common electrode 133 is located between the insulating layer 137E and the insulating layer 337F.

The auxiliary scan line 339 substantially overlaps with the scan line 132, and the auxiliary scan line 339 and the scan line 132 are in different film layers. It is possible that a line width W3 of the auxiliary scan line 339 is not greater than the first scan line width W1 of the scan line 132 or is even not greater than the second scan line width W2 of the scan line 132 but is not limited thereto. In some embodiments, the line width W3 may be the maximum width of the auxiliary scan line 339 in the direction perpendicular to the first direction D1. In addition, as shown in FIG. 9, the scan line 132 is located between the insulating layer 137B and the insulating layer 137C, and the auxiliary scan line 339 is located between the insulating layer 137D and the insulating layer 337F. In the present embodiment, the auxiliary scan line 339 may be electrically connected to the scan line 132 via the scan connection electrode 339'. For example, the auxiliary scan line 339 may be physically connected (or electrically connected) to the scan connection electrode 339' via a via VA6, and the scan connection electrode 339' may be physically connected (or electrically connected) to the scan line 132 via a via VA7. The via VA6 penetrates through the insulating layer 137D and exposes the scan connection electrode 339', and the via VA7 penetrates through the insulating layer 137C and exposes the scan line 132. In other words, the via VA6, the scan connection electrode 339', and the via VA7 form a communication structure between the auxiliary scan line 339 and the scan line 132. In the present embodiment, although not shown in the figures, a plurality of communication structures may be disposed between the auxiliary scan line 339 and the scan line 132 such that the auxiliary scan line 339 and the scan line 132 are electrically connected in parallel, which reduces the impedance of the scan line 132 and thereby helps to alleviate the resistance-capacitance delay effect of the scan line 132.

In addition, the film layer of the auxiliary scan line 339 is different from the film layer of the scan line 132 and is different from the film layer of the data line 134. The auxiliary scan line 339 may be in the same film layer as the auxiliary pixel connection electrode 331'. For example, while the via VA6 is manufactured, the via VA3 may be formed corresponding to the pixel connection electrode 131', and while the auxiliary scan line 339 is manufactured, the auxiliary pixel connection electrode 331' may be manufactured corresponding to the via VA3. Accordingly, the auxiliary pixel connection electrode 331' may be physically connected (or electrically connected) to the pixel connection electrode 131' via the via VA3. Afterwards, before the pixel electrode 131 is manufactured, a via VA8 may be formed.

The via VA8 penetrates through the insulating layer 337F and the insulating layer 137E and exposes the auxiliary pixel connection electrode 331'. Next, while the pixel electrode 131 is manufactured, the pixel electrode 131 is extended into the via VA8, and then the pixel electrode 131 may be physically connected (or electrically connected) to the auxiliary pixel connection electrode 331' via the via VA8. Accordingly, the pixel electrode 131 is physically connected (or electrically connected) to the auxiliary pixel connection electrode 331', the auxiliary pixel connection electrode 331' is physically connected (or electrically connected) to the pixel connection electrode 131', and the pixel connection electrode 131' is physically connected (or electrically connected) to the semiconductor layer 136 to achieve the desired electrical connection relationship.

According to the above, in the electronic device of the embodiments of the disclosure, the scan line of the driving layer includes the first scan line segment, the first scan line segment has the first branch and the second branch, and the first branch and the second branch are electrically connected in parallel. The data line intersects with the first branch and the second branch, so that the impedance load caused by the data line to the scan line decreases, and thereby the resistance-capacitance delay effect of the scan line is alleviated. The semiconductor layer intersects with the first branch and the second branch and may form a dual-gate active component. Since the first branch and the second branch are connected in parallel, the impedance load caused by the dual gates to the scan line also decreases, and thereby the resistance-capacitance delay effect of the scan line is alleviated. In addition, in some embodiments, different line segments of the scan line may be formed from different film layers, and the different film layers have different electrical conductivities, which also helps to adjust the impedance of the scan line. In some other embodiments, the driving layer of the electronic device is additionally provided with the auxiliary scan line, such that the auxiliary scan line is electrically connected in parallel with the scan line, which also helps to alleviate the resistance-capacitance delay effect of the scan line. Therefore, the electronic device according to the embodiments of the disclosure can provide ideal driving performance and help to improve or stabilize the display effect of the electronic device.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An electronic device comprising:
  a first substrate;
  a second substrate disposed opposite to the first substrate; and
  a driving layer disposed between the first substrate and the second substrate, wherein the driving layer comprises:
    a scan line disposed on the first substrate, wherein the scan line comprises a first scan line segment, the first scan line segment has an opening and comprises a first branch and a second branch, and the first branch and the second branch are located on two opposite sides of the opening; and
    a data line disposed on the first substrate and intersecting with the scan line.

2. The electronic device according to claim 1, wherein the driving layer further comprises a semiconductor layer, a portion of the semiconductor layer overlapping with the first branch is defined as a first channel region, and a portion of the semiconductor layer overlapping with the second branch is defined as a second channel region.

3. The electronic device according to claim 2, wherein the semiconductor layer further comprises an intermediate region located between the first channel region and the second channel region.

4. The electronic device according to claim 3, wherein the first channel region, the intermediate region, and the second channel region are arranged along an arrangement direction, the scan line has an extending direction, and the arrangement direction is different from the extending direction.

5. The electronic device according to claim 3, wherein doping concentrations of the first channel region and the second channel region are lower than a doping concentration of the intermediate region.

6. The electronic device according to claim 5, wherein the semiconductor layer is divided into a first segment, a second segment, and a third segment, and the doping concentration of the intermediate region is lower than doping concentrations of the second segment and the third segment.

7. The electronic device according to claim 3, wherein the intermediate region is located in the opening.

8. The electronic device according to claim 2, wherein at least one of the first channel region and the second channel region is spaced apart from the data line by a distance.

9. The electronic device according to claim 2, wherein a portion of the first branch overlapping with the first channel region is defined as a first gate, a portion of the second branch overlapping with the second channel region is defined as a second gate, and the semiconductor layer is defined as an active component having dual gates.

10. The electronic device according to claim 1, wherein the scan line further comprises a second scan line segment, and the first scan line segment is connected to the second scan line segment.

11. The electronic device according to claim 10, wherein the first scan line segment has a first scan line width, the second scan line segment has a second scan line width, and the first scan line width is greater than the second scan line width.

12. The electronic device according to claim 11, wherein a spacing is between the first branch and the second branch, and the first scan line width is a sum of a first branch line width of the first branch, a second branch line width of the second branch, and the spacing.

13. The electronic device according to claim 10, wherein the first scan line segment and the second scan line segment are electrically connected to each other through a via.

14. The electronic device according to claim 10, wherein the second scan line segment comprises different segments having different line widths.

15. The electronic device according to claim 10, wherein in the second scan line segment, one line segment has a line width less than or equal to a sum of the first branch line width and the second branch line width.

16. The electronic device according to claim 1, wherein the driving layer further comprises an auxiliary scan line, and the auxiliary scan line and the scan line are electrically connected to each other through a via.

17. The electronic device according to claim 1, wherein the first scan line segment further comprises a connection portion, and the connection portion is connected between the first branch and the second branch.

18. The electronic device according to claim 17, wherein a number of the connection portion is two, and two connection portions, the first branch, and the second branch collectively enclose the opening.

19. The electronic device according to claim 1 wherein the data line overlaps with the first branch from a top view.

20. The electronic device according to claim 1, further comprising a common line, the common line intersects with the data line, and the common line and the scan line are in a same layer.

* * * * *